United States Patent
Mohapatra et al.

(10) Patent No.: US 10,586,848 B2
(45) Date of Patent: Mar. 10, 2020

(54) APPARATUS AND METHODS TO CREATE AN ACTIVE CHANNEL HAVING INDIUM RICH SIDE AND BOTTOM SURFACES

(71) Applicant: Intel Corporation, Santa Clara, CA (US)

(72) Inventors: Chandra S. Mohapatra, Beaverton, OR (US); Anand S. Murthy, Portland, OR (US); Glenn A. Glass, Portland, OR (US); Matthew V. Metz, Portland, OR (US); Willy Rachmady, Beaverton, OR (US); Gilbert Dewey, Hillsboro, OR (US); Tahir Ghani, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/071,894

(22) PCT Filed: Feb. 22, 2016

(86) PCT No.: PCT/US2016/018981
§ 371 (c)(1),
(2) Date: Jul. 20, 2018

(87) PCT Pub. No.: WO2017/146676
PCT Pub. Date: Aug. 31, 2017

(65) Prior Publication Data
US 2019/0035889 A1 Jan. 31, 2019

(51) Int. Cl.
*H01L 29/06* (2006.01)
*H01L 21/02* (2006.01)
(Continued)

(52) U.S. Cl.
CPC .......... *H01L 29/0673* (2013.01); *B82Y 10/00* (2013.01); *H01L 21/0243* (2013.01);
(Continued)

(58) Field of Classification Search
CPC .......... H01L 29/0673; H01L 29/78696; H01L 29/66469; H01L 29/775; H01L 29/785;
(Continued)

(56) References Cited

U.S. PATENT DOCUMENTS

2010/0163847 A1* 7/2010 Majhi ............... H01L 21/28518
257/24
2010/0301390 A1* 12/2010 Ko ..................... H01L 29/7851
257/190
(Continued)

FOREIGN PATENT DOCUMENTS

| KR | 20150126310 | 11/2015 |
|----|-------------|---------|
| WO | 2014209390  | 12/2014 |
| WO | 2015147858  | 10/2015 |

OTHER PUBLICATIONS

International Preliminary Report on Patentability from PCT/US2016/018981 notified Sep. 7, 2018, 6 pgs.
(Continued)

*Primary Examiner* — Dao H Nguyen
(74) *Attorney, Agent, or Firm* — Green, Howard & Mughal LLP

(57) ABSTRACT

Transistor devices having an indium-containing ternary or greater III-V compound active channels, and processes for the fabrication of the same, may be formed that enables improved carrier mobility when fabricating fin shaped active channels, such as those used in tri-gate or gate all around (GAA) devices. In one embodiment, an indium-containing ternary or greater III-V compound may be deposited in narrow trenches on a reconstructed upper surface of a
(Continued)

sub-structure, which may result in a fin that has indium rich side surfaces and an indium rich bottom surface. These indium rich surfaces will abut a gate oxide of a transistor and may result in high electron mobility and an improved switching speed relative to conventional homogeneous compositions of indium-containing ternary or greater III-V compound active channels.

15 Claims, 13 Drawing Sheets

(51) Int. Cl.
    *H01L 21/324*     (2006.01)
    *H01L 29/423*     (2006.01)
    *H01L 29/40*     (2006.01)
    *H01L 29/10*     (2006.01)
    *H01L 29/775*     (2006.01)
    *H01L 29/66*     (2006.01)
    *B82Y 10/00*     (2011.01)
    *H01L 29/786*     (2006.01)
    *H01L 21/306*     (2006.01)
    *H01L 21/764*     (2006.01)
    *H01L 29/08*     (2006.01)
    *H01L 29/20*     (2006.01)
    *H01L 29/78*     (2006.01)
(52) U.S. Cl.
    CPC .... *H01L 21/0262* (2013.01); *H01L 21/02461* (2013.01); *H01L 21/02463* (2013.01); *H01L 21/02543* (2013.01); *H01L 21/02546* (2013.01); *H01L 21/02549* (2013.01); *H01L 21/02579* (2013.01); *H01L 21/02639* (2013.01); *H01L 21/30612* (2013.01); *H01L 21/3245* (2013.01); *H01L 21/764* (2013.01); *H01L 29/0649* (2013.01); *H01L 29/0847* (2013.01); *H01L 29/1033* (2013.01); *H01L 29/1079* (2013.01); *H01L 29/20* (2013.01); *H01L 29/401* (2013.01); *H01L 29/42392* (2013.01); *H01L 29/66469* (2013.01); *H01L 29/66522* (2013.01); *H01L 29/66795* (2013.01); *H01L 29/775* (2013.01); *H01L 29/785* (2013.01); *H01L 29/78696* (2013.01); *H01L 21/30625* (2013.01)

(58) Field of Classification Search
    CPC ............... H01L 29/1079; H01L 29/401; H01L 29/66795; H01L 29/66522; H01L 21/02463; H01L 21/0243; H01L 21/02639; H01L 21/02461; H01L 21/02579; H01L 21/764; H01L 21/30612; B82Y 10/00
    USPC .......... 257/347, 288, 24, 192, 190, E29.068, 257/E29.246, E29.255, E21.398, E21.409, 257/E31.022; 438/268, 285, 197
    See application file for complete search history.

(56) References Cited

U.S. PATENT DOCUMENTS

| | | | |
|---|---|---|---|
| 2014/0346564 A1 | 11/2014 | Doornbos et al. | |
| 2015/0243756 A1* | 8/2015 | Obradovic | H01L 29/66795 438/285 |
| 2015/0279933 A1* | 10/2015 | Xiao | H01L 21/2252 257/400 |
| 2017/0229543 A1* | 8/2017 | Glass | H01L 29/045 |

OTHER PUBLICATIONS

International Search Report and Written Opinion from PCT/US2016/018981 notified Nov. 21, 2016, 11 pgs.

* cited by examiner

APPARATUS AND METHODS TO CREATE AN ACTIVE CHANNEL HAVING INDIUM RICH SIDE AND BOTTOM SURFACES

CLAIM OF PRIORITY

This application is a National Stage Entry of, and claims priority to, PCT Application No. PCT/US2016/018981, filed on Feb. 22, 2016 and titled "APPARATUS AND METHODS TO CREATE AN ACTIVE CHANNEL HAVING INDIUM RICH SIDE AND BOTTOM SURFACES", which is incorporated by reference in its entirety for all purposes.

TECHNICAL FIELD

Embodiments of the present description generally relate to the field of microelectronic devices, and, more particularly, to forming an active channel in a microelectronic transistor having indium rich surfaces to increase carrier mobility.

BACKGROUND

Higher performance, lower cost, increased miniaturization of integrated circuit components, and greater packaging density of integrated circuits are ongoing goals of the microelectronic industry for the fabrication of microelectronic devices. To achieve these goals, transistors within the microelectronic devices must scale down, i.e. become smaller. Along with the reduction in the size of transistors, there has also been a drive to improve their efficiency with improvement in their designs, materials used, and/or in their fabrication processes. Such design improvements include the development of unique structures, such as non-planar transistors, including tri-gate transistors, FinFETs, TFETS, omega-FETs, and double-gate transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
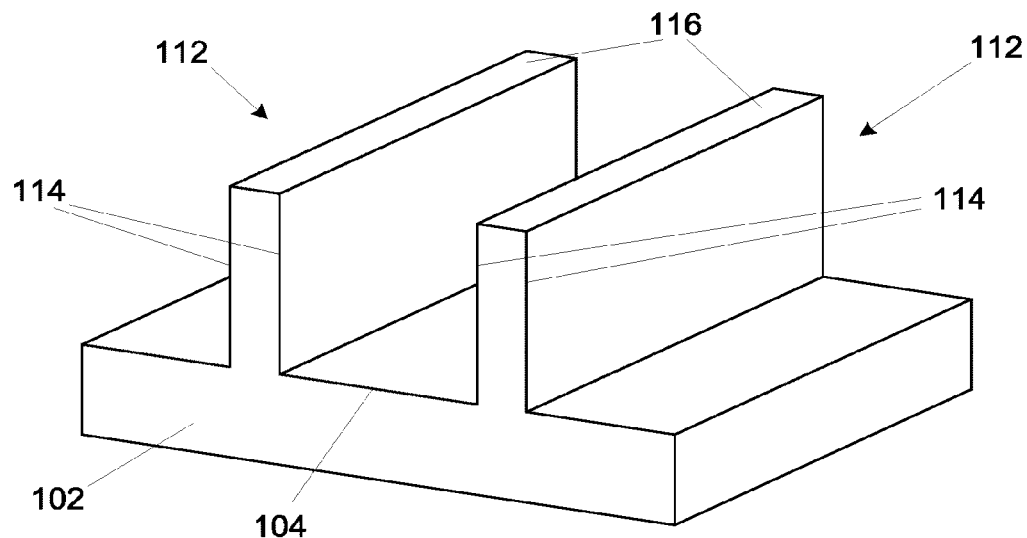
FIGS. 1-16 are oblique sectional views, side cross-section views, and graphical illustrations of the fabrication of an indium-containing ternary or greater III-V compound active channel with a sub-structure for a non-planar transistor, according to another embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

As known to those skilled in the art, III-V group materials can have higher electron mobility relative to conventional silicon materials commonly used in microelectronic transistor fabrication and therefore have potential for use in high performance transistors in integrated circuit manufacture. Embodiments of the present description related to indium-containing ternary or greater III-V compound active channels, and processes for the fabrication of the same, that enables improved carrier mobility when fabricating fin shaped active channels, such as those used in tri-gate or gate all around (GAA) devices. In one embodiment, a sub-structure may be deposited in a narrow trench and an upper surface of the sub-structure may be reconstructed. An indium-containing ternary or greater III-V compound may then be deposited in narrow trenches to abut the sub-structure upper surface, which may result in a fin that has indium rich side surfaces and an indium rich bottom surface with a gallium rich central portion. At least one of the indium rich surfaces may abut a gate oxide of a transistor and result in high electron mobility and an improved switching speed relative to conventional homogeneous compositions of indium-containing ternary or greater III-V compound active channels.

As shown in FIG. 1, at least one fin 112 may be formed on a substrate 102, wherein the fins 112 may include opposing sidewalls 114 extending from a first surface 104 of the substrate 102 and which terminate in an upper surface 116. For the clarity and brevity, only two fins 112 are illustrated in FIG. 1; however, it is understood that any appropriate number of fins 112 could be fabricated. In one embodiment, an etch mask (not shown) may be patterned on the substrate 102 followed by the etching of the substrate 102, wherein the portions of the substrate 102 protected by etch mask (not shown) become the fins 112, and the etch mask (not shown) may be thereafter removed, as will be understood to those skilled in the art. In an embodiment of the present disclosure, the substrate 102 and the fins 112 may be any appropriate material, including, but not limited to, a silicon-containing material, such as monocrystalline silicon. The substrate 102 and the fins 112, however, need not necessarily be fabricated from silicon-containing materials, and can be other types of materials known in the art. In a further embodiment, the substrate 102 may comprise a silicon-on-insulator (SOI) substrate, a silicon-on-nothing (SON), a germanium substrate, a germanium-on-insulator (GeOI) substrate, or a germanium-on-nothing (GeON).

Figure 2:
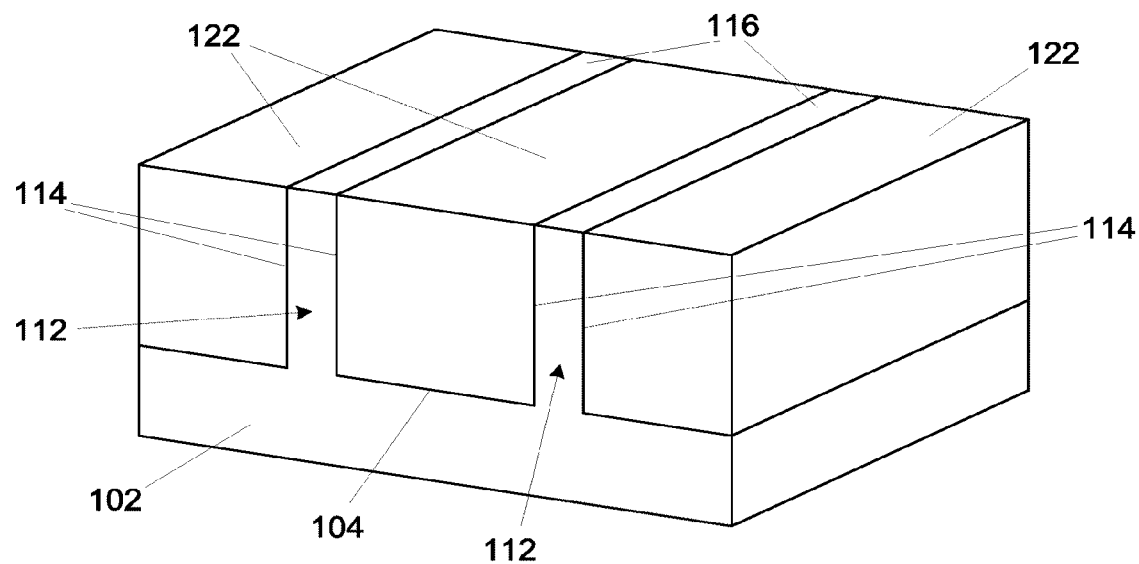

As shown in FIG. 2, a dielectric material may be deposited, by any appropriate deposition process, over the substrate 102 and the fins 112, and the dielectric material may be planarized to expose the fin upper surface 116, thereby forming isolation structures 122, known as shallow trench isolation structures, abutting the opposing fin sidewalls 114. The isolation structures 122 may be formed from any appropriate dielectric material, including but not limited to, silicon oxide ($SiO_2$).

Figure 3:
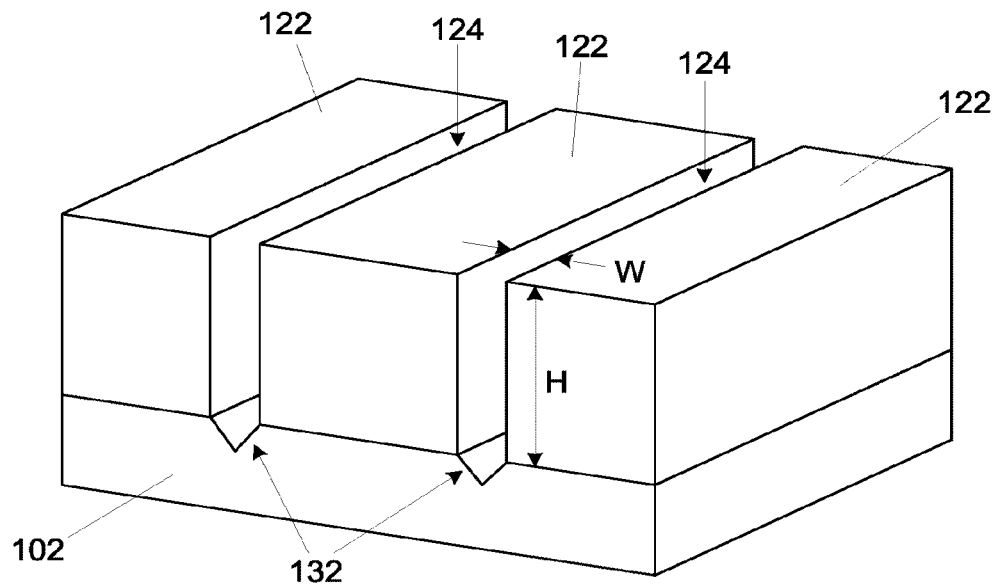

As shown in FIG. 3, the fins 112 may be removed, thereby forming a trench 124. The fins 112 may be removed by any known etching techniques, including, but not limited to, dry etching, wet etching, or combinations thereof. In one embodiment, a portion of the each trench 124 may be formed to extend into the substrate 102 either during the removal of the fins 112 or thereafter. This portion of the trench 124 will hereinafter be referred to as a nucleation trench 132. In one embodiment, the nucleation trench 132 may have a (111) faceting, which may facilitate the growth of a III-V material, as will be discussed. It is understood that alternate geometries of the nucleation trench 132 may be utilized. In an embodiment, the narrow trench 124 may have a height H in the range of about 50 to 500 nm and a width W in the range from about sub-10 nm to about 30 nm.

Figure 4:
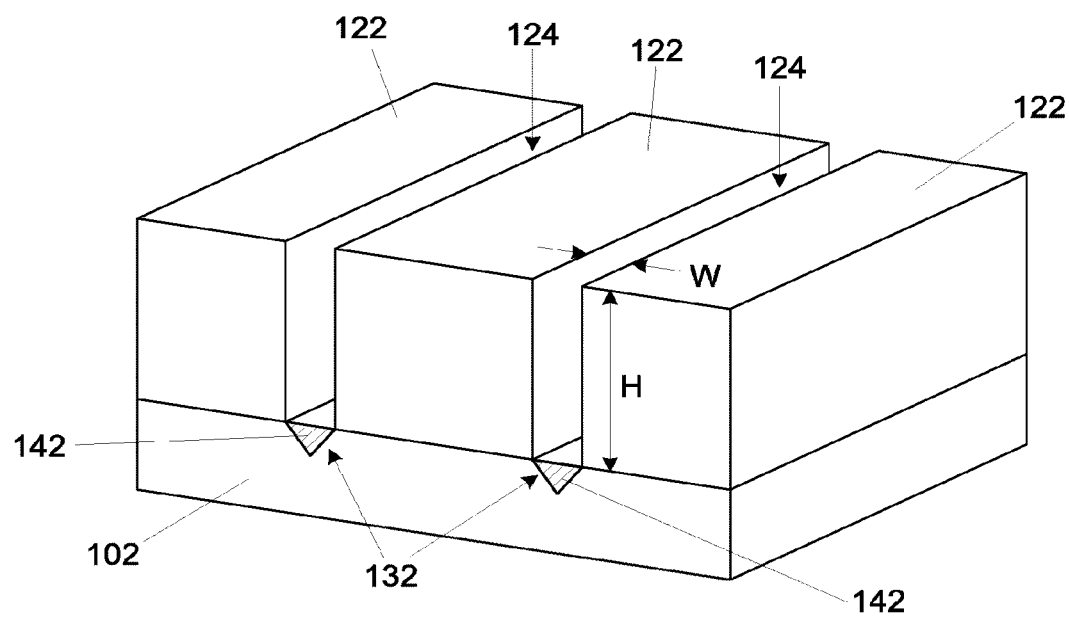

As shown in FIG. 4, a nucleation layer 142 may be formed in the nucleation trench 132. The nucleation layer 142 may be formed by any formation process and may be any appropriate material, such as a III-V epitaxial material, including but not limited to, indium phosphide, gallium phosphide, gallium arsenide, and like. The nucleation layer 142 may be doped or undoped, and may be formed by epitaxial deposition.

Figure 5:
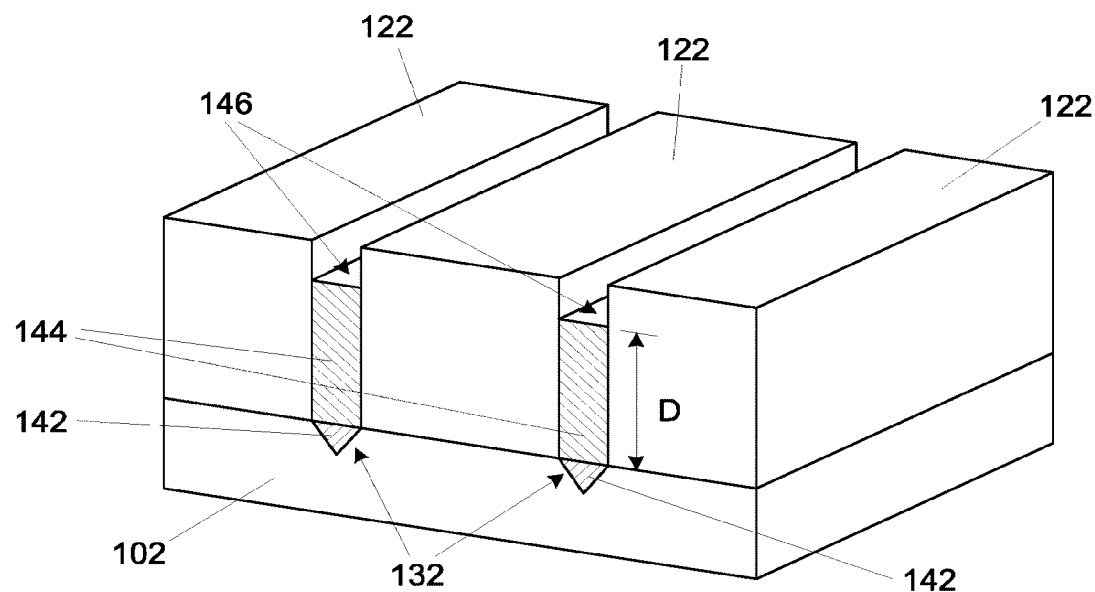

As shown in FIG. 5, a sub-structure 144 may be formed on the nucleation layer 142 within the trench 124 (see FIG. 4) and may include an upper surface 146 opposing the nucleation layer 142. The sub-structure 144 may be formed by any known formation process. In one embodiment, the sub-structure 144 may have a depth D that is about 80% of the height H of the trench 124 (see FIG. 3).

In one embodiment of the present description, the sub-structure 144 may be a high band-gap III-V material, including, but not limited to, indium aluminum arsenide, indium phosphide, gallium phosphide, gallium arsenide, gallium arsenide antimonide, aluminium arsenide antimonide, indium aluminum gallium arsenide, indium aluminum gallium phosphide, aluminum gallium arsenide, and the like. For the purpose of the present description, a low band-gap material may be defined to be a material that has a band-gap less than silicon and a high band-gap material may be defined to be a material that has a band-gap greater than silicon.

The high band-gap material utilized for the sub-structure 144 may be selected to have the desired conduction band offset with a subsequently formed indium-containing ternary or greater III-V compound active channel which will be effective in excluding electrons from the sub-structure 144, thereby reducing leakage. The high band-gap material may be doped or undoped. In a doped embodiment, the high band-gap material may be doped with a dopant, such as a p-type dopant, including but not limited to magnesium, zinc, carbon, beryllium, and the like. In a further doped embodiment, the sub-structure 144 may be a channel material selected from the group consisting of indium gallium arsenide, indium arsenide, and indium antimonide. Such a combination of high band-gap material and dopants may be more effective than a dopant alone for reducing leakage, so long as fabrication process result in an acceptably low crystalline concentration, as will be understood to those skilled in the art.

In one embodiment, the doped sub-structure 144 may be the same material as the nucleation layer 142, such that few or no lattice defects occur. In other embodiments, the nucleation layer 142 may be graded into the sub-structure 144 or the material compositions thereof may be stepped in concentration from one to the other, as will be understood to those skilled in the art.

In some example embodiments, the sub-structure 144 may be epitaxially deposited. In some embodiments, a chemical vapor deposition (CVD) process or other suitable deposition technique may be used for the depositing or otherwise forming the sub-structure 144. For example, the deposition may be carried out by CVD, or rapid thermal CVD (RT-CVD), or low pressure CVD (LP-CVD), or ultra-high vacuum CVD (UHV-CVD), or gas source molecular beam epitaxy (GS-MBE) tools using III-V material compounds, such as combinations of indium, aluminum, arsenic, phosphorus, gallium, antimony, and/or precursors thereof. In one example embodiment, the sub-structure 144 may be gallium arsenide doped with zinc to provide zinc concentrations of up to approximately 1E19 atom/$cm^3$, which may result in a resistivity of about 5E-3 Ohm-cm (or a corresponding conductivity of up to 200 Mho/cm). In any such embodiments, there may be a precursor bubbler with a carrier gas such as, for instance, hydrogen, nitrogen, or a noble gas (e.g., precursor may be diluted at about 0.1-20% concentration with the balance being carrier gas). In some example cases, there may be an arsenic precursor such as arsine or tertiary butyl arsine, a phosphorous precursor such as tertiary butylphosphine, a gallium precursor such as trimethylgallium, and/or an indium precursor such as trimethylindium. There may also be an etchant gas such as, for example, halogen-based gas such as hydrogen chloride (HCl), chlorine (Cl), or, hydrogen bromide (HBr). The basic deposition of the sub-structure 144 may be possible over a wide range of conditions using a deposition temperature in the range, for example, from between about 300° C. and 650° C., or in a more specific example, from between about 400 and 500° C.) and a reactor pressure, for instance, in the range of about 1 Torr to 760 Torr. Each of the carrier and etchants can have a flow in the range of between about 10 and 300 SCCM (typically, no more than 100 SCCM of flow is required, but some embodiments may benefit from higher flow rates). In one specific example embodiment, the deposition of sub-structure 144 may be carried out at a flow rate that ranges between about 100 and 1000 SCCM. For an in-situ doping of zinc, for instance, a bubbler source using di-ethyl zinc (DEZ) may be used (e.g., hydrogen gas bubbled through liquid DEZ and at a flow rate that ranges between about 10 and 100 SCCM).

Figure 6:
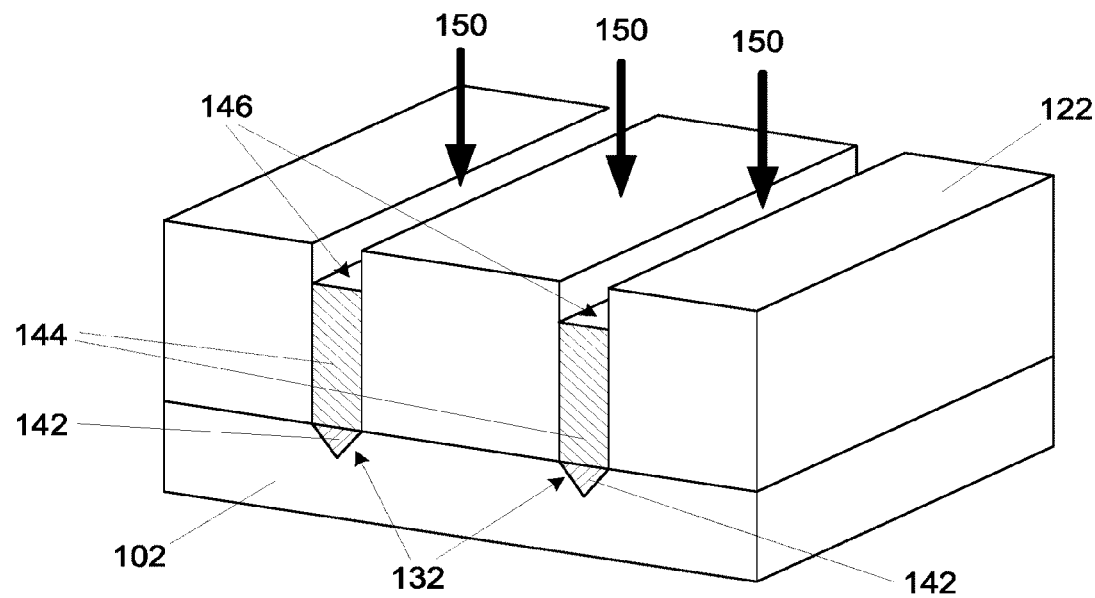

As shown in FIG. 6, the sub-structure 144 may be treated (generically illustrated with arrows 150) to reconstruct the upper surface 146 thereof, such that indium will migrate toward the sub-structure upper surface 146 during a subsequent formation of an indium-containing ternary or greater III-V compound active channel, as will be discussed.

In an embodiment, the treatment 150 may be a thermal or heating process, wherein the sub-structure 144 may be subjected to a temperature of between about 500° C. and 800° C. for a duration of time between about 30 seconds and 25 minutes. In a specific embodiment, the temperature of heating process may be about 750° C.

In a further embodiment, the treatment 150 may comprise exposing the sub-structure upper surface 146 to an etchant. In one embodiment, the etchant may comprise tetramethylammonium hydroxide and similar chemistries.

Figure 7:
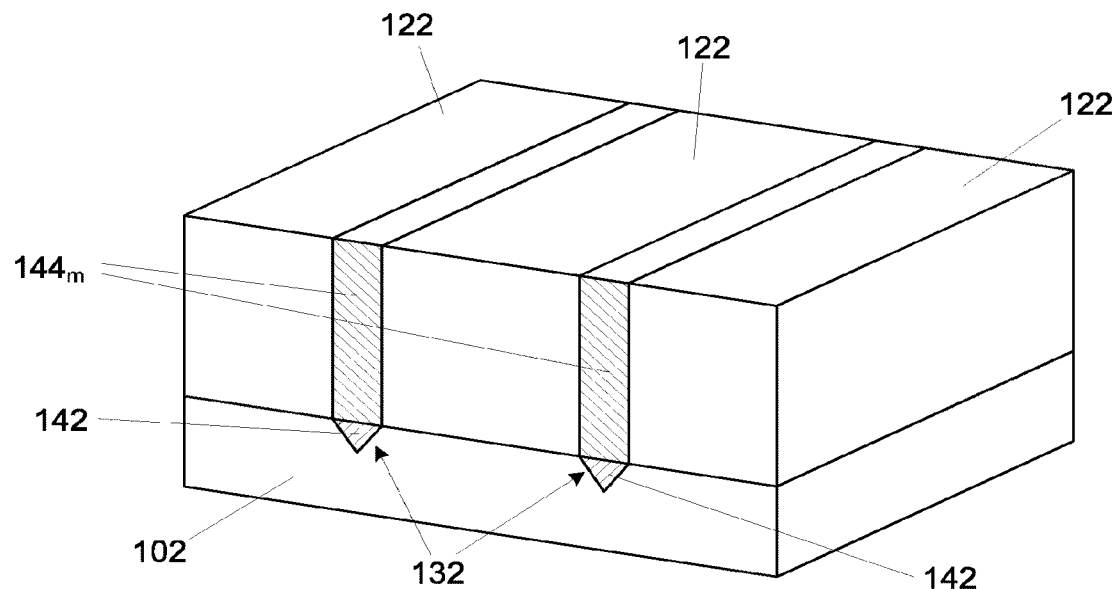
Figure 8:
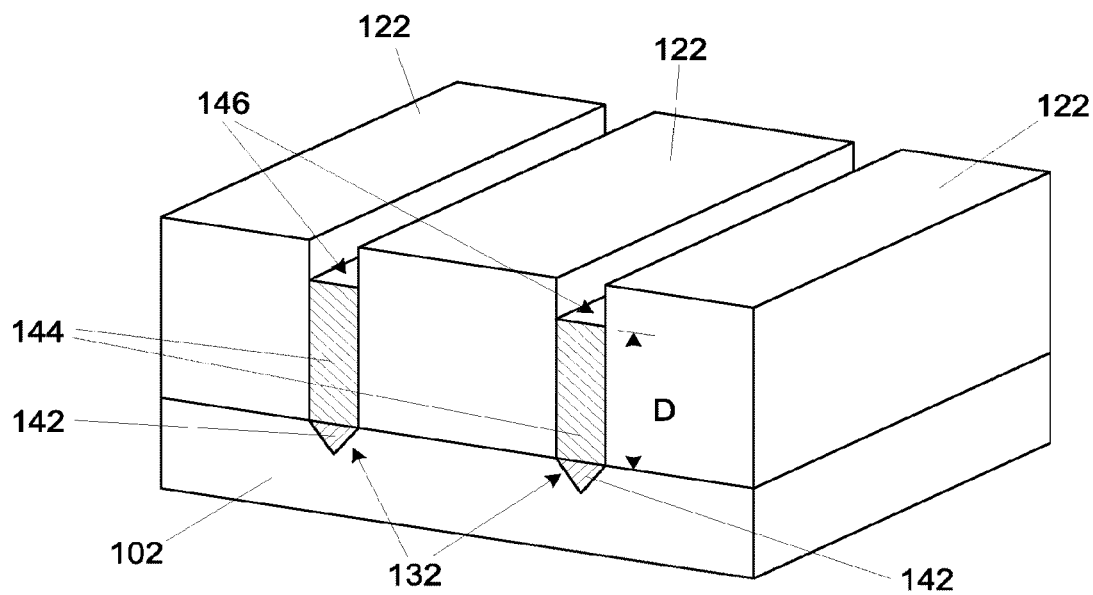

FIGS. 7 and 8 illustrate another embodiment of the treatment 150 (see FIG. 6). As shown in FIG. 7, the sub-structure material $144_m$ may be formed to filled the trench 124 (see FIG. 4) wherein any portion of the sub-structure material $144_m$ not within the trench 124 (see FIG. 4) may be removed, such as with chemical mechanical polishing. As show in FIG. 8, sub-structure material $144_m$ (see FIG. 7) may be etched down to the depth D to form the sub-structure 144. The etching of the sub-structure material $144_m$ (see FIG. 7) will form a reconstructed sub-structure upper surface 146 for the sub-structure 144.

In one embodiment, the treatment 150 of the sub-structure upper surface 146 may reconstruct it from a predominantly <111> lattice structure to a predominantly <100>. The term "predominantly" is defined to mean that the cited lattice arrangement has a greater presence in the sub-structure upper surface 146 than any other lattice arrangement.

The present description will hereafter describe the formation of an indium gallium arsenide active channel (labeled as element 152); however, the active channel is not so limited, as it can be formed from any appropriate indium-containing ternary or greater III-V compound. In one embodiment, the indium-containing ternary or greater III-V compound may comprise one of indium gallium arsenide, indium gallium antimonide, indium gallium arsenide antimonide, indium gallium phosphide, indium gallium arsenide phosphide, indium gallium antimonide phosphide, and indium gallium arsenide antimonide phosphide.

Figure 9:
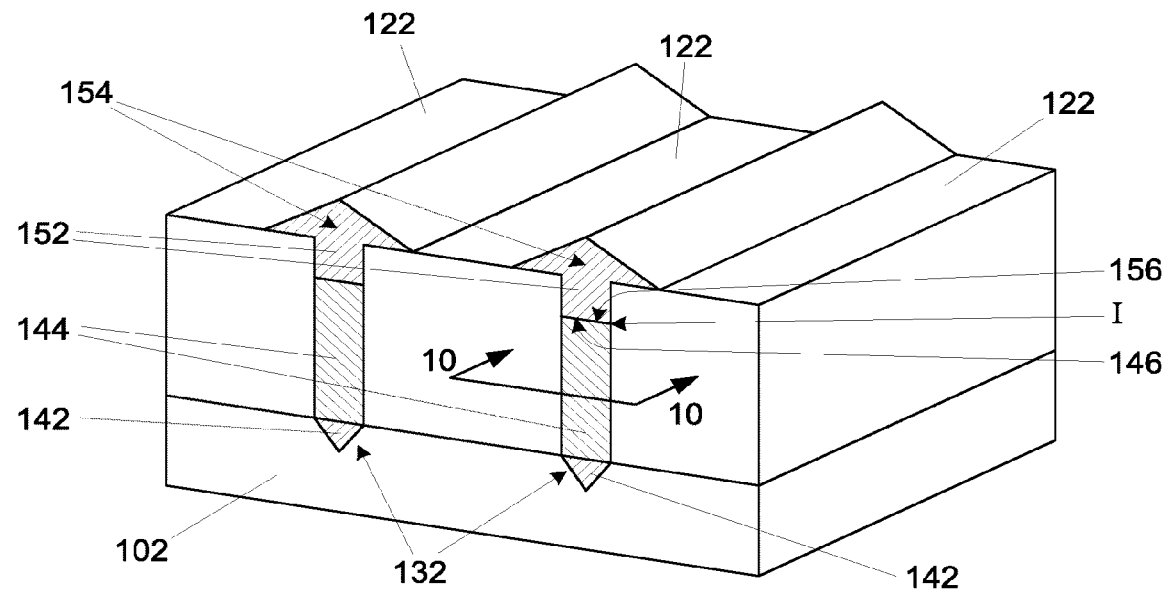
Figure 10:
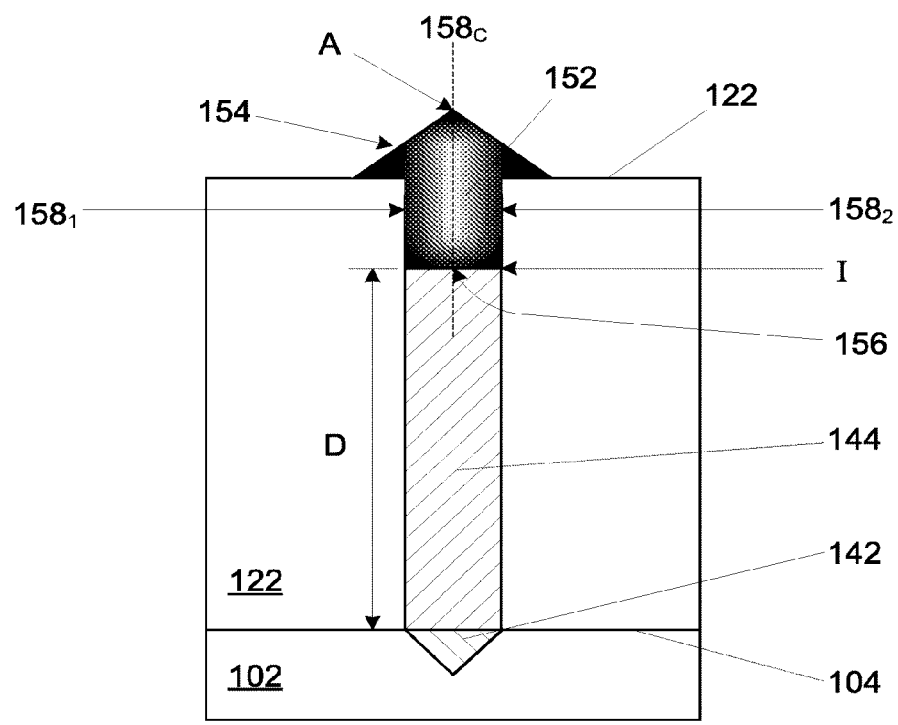

As shown in FIGS. 9 and 10, an indium gallium arsenide active channel 152 may be formed on the sub-structure 144 within the trench 124 (see FIG. 4). In some embodiments, a chemical vapor deposition (CVD) process or other suitable deposition technique may be used for the depositing or otherwise forming the active channel 152. For example, the deposition may be carried out by CVD, or rapid thermal CVD (RT-CVD), or low pressure CVD (LP-CVD), or ultra-high vacuum CVD (UHV-CVD), or gas source molecular beam epitaxy (GS-MBE) tools using indium, gallium, and arsenic, and/or precursors thereof. In one specific such example embodiment, the active channel 152 may be undoped indium gallium arsenide, and the nucleation layer 142 and the doped sub-structure 144 may be gallium arsenide or indium phosphide. In any such embodiments, there may be a precursor bubbler with a carrier gas such as, for instance, hydrogen, nitrogen, or a noble gas (e.g., precursor may be diluted at about 0.1-20% concentration with the balance being carrier gas). In some example cases, there may be indium precursor such as trimethylindium, a gallium precursor such as trimethylgallium, and/or an arsenic precursor such as arsine or tertiary butyl arsine. There may also be an etchant gas such as, for example, halogen-based gas such as hydrogen chloride (HCl), chlorine (Cl), or, hydrogen bromide (HBr). The basic deposition of the indium gallium arsenide active channel 152 may be possible over a wide range of conditions using a deposition temperature in the range, for example, from between about 300° C. and 650° C., or in a more specific example, from between about 400 and 600° C.) and a reactor pressure, for instance, in the range of about 1 Torr to 760 Torr. Each of the carrier and etchants can have a flow in the range of between about 10 and 300 SCCM (typically, no more than 100 SCCM of flow is required, but some embodiments may benefit from higher flow rates). In one specific example embodiment, the deposition of the active channel 152 may be carried out at a flow rate that ranges between about 100 and 1000 SCCM.

The formation of the nucleation layer 142, the sub-structure 144, and the indium gallium arsenide active channel 152 may occur in a relatively narrow trench 124. In one embodiment the doped sub-structure 144 may have a depth D (e.g. the distance between the substrate 102 and the indium gallium arsenide active channel 152 (see FIG. 3)) of greater than about 50 nm and a width of less than about 25 nm (i.e. the trench width W (see FIG. 3)). Furthermore, as the formation of the nucleation layer 142, the sub-structure 144, and the active channel 152 occurs in a relatively narrow trench 124. Lattice mismatch between the substrate 102 and the nucleation layer 142/sub-structure 144 can be larger than that which allows for substantially defect free formation, such the nucleation layer 142/sub-structure 144 may be formed to have the sufficient depth D to trap defects, such as stacking faults, dislocations, and the like, away from the indium gallium arsenide active channel 152, as will be understood to those skilled in the art. Thus, electron mobility in the active channel 152 may not be significantly impaired thereby.

As still further shown in FIGS. 9 and 10, a portion 154 of indium gallium arsenide active channel 152 may extend out of the trench 124 (see FIG. 4), particularly when epitaxial growth processes are utilized. With the deposition conditions discussed above, the indium gallium arsenide active channel 152 may be grown in the narrow trench 124 (see FIG. 4), such that the growth surface facets in a self-assembled fashion into a long "hut-shape" with <111> lattice top surfaces or "elongated hut-like growth" of the portion 154. The described process conditions are conducive to creating this faceted growth that permits sufficient adatom migration thereby achieving this low energy-state surface shape, as will be understood to those skilled in the art. It has been found that the energetics of incorporating gallium are different from those of incorporating indium in terms of a natural tendency for gallium to preferentially incorporate at along center region, while indium will incorporate preferentially at the edges, e.g. indium rich side surfaces $158_1$ and $158_2$, of the indium gallium arsenide active channel 152. In specific, the temperature and precursor flows may be tuned to maximize the sharpness of the hut-roof structure, i.e., the portion 154 of indium gallium arsenide active channel 152 that extends out of the trench 124 (see FIG. 4) and hence achieves the concentration profile shown in FIG. 10. For weakly faceted growth conditions, such as obtained with a lower temperature, e.g. about 580° C., and high metal species precursor fluxes, the effect may be limited to wide trenches, such as about 30 nm. By increasing the process temperature to 580° C., for example, and/or the metal species precursor fluxes, the faceting can be improved and the effect can extend to narrower trenches of 15 nm, for example. It is believed that the effect can be driven to sub-10 nm trenches as well.

As shown in FIG. 10, the process of the present description results in the indium migrating toward opposing sidewall surfaces of the indium gallium arsenide active channel 152 adjacent the isolation structures 122, thereby forming indium rich side surfaces $158_1$ and $158_2$, and the reconstruction of the sub-structure upper surface 146 (see FIG. 9) results in the indium migrated toward the sub-structure upper surface 146 (see FIG. 9) to form an indium rich bottom surface 156. The distribution of the indium is illustrated in FIG. 10 with the indium having darker shading. The indium distribution of the indium gallium arsenide active channel 152, from side to side, is graphically illustrated in FIG. 11 with the x-axis being the distance from one indium rich side surface $158_1$ to the opposing indium rich side surface $158_2$ of the indium gallium arsenide active channel 152, and the y-axis being concentration in percentage of the indium (black dotted line) and the gallium (white dotted line) across the x-axis distance (in nanometers). A center region $158_c$ may be at approximately a midline between one indium rich side surface $158_1$ and the opposing indium rich side surface $158_2$. A line for arsenic is not shown of clarity and conciseness, but makes up the remainder of material within the indium gallium arsenide active channel 152.

Figure 12:
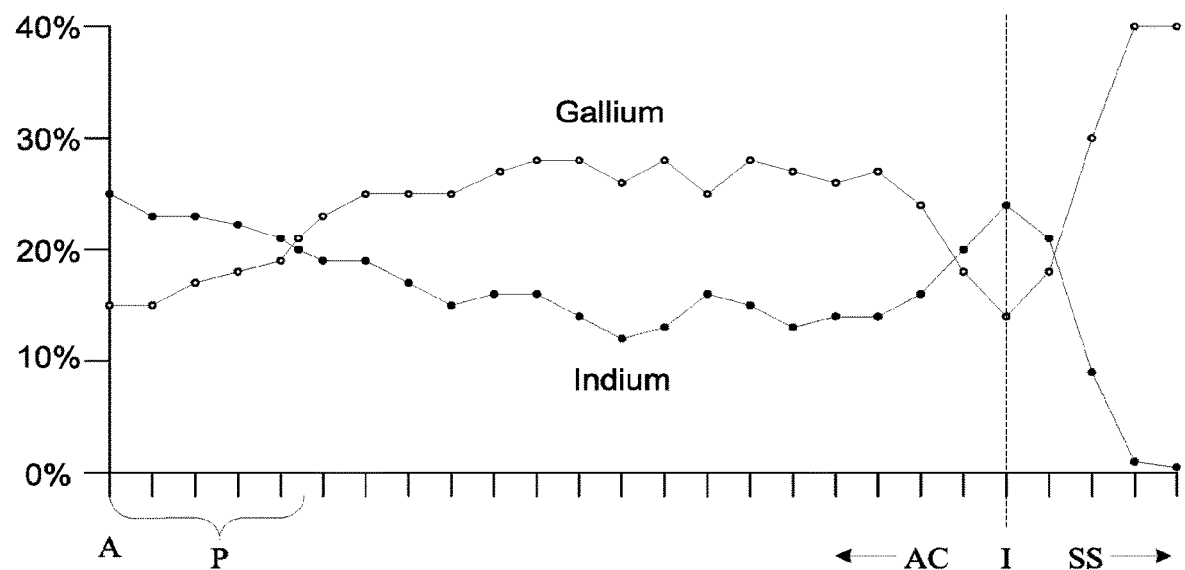

The indium distribution of the indium gallium active channel 152, from top to bottom, is graphically illustrated in FIG. 12 with the x-axis being the distance from a top or apex "A" of the indium gallium arsenide active channel 152, through the indium gallium active channel portion 154 (labeled as "P"), through the remainder of the indium gallium arsenide active channel 152 (labeled as "AC") through the indium rich bottom surface 156 proximate to the interface "I" and into the sub-structure 144 (labeled as "SS"), and the y-axis being concentration in percentage of the indium (black dotted line) and the gallium (white dotted line) across the x-axis distance (in nanometers). A line for arsenic is not shown of clarity and conciseness, but makes up the remainder of material within the indium gallium active channel 152.

Figure 11:
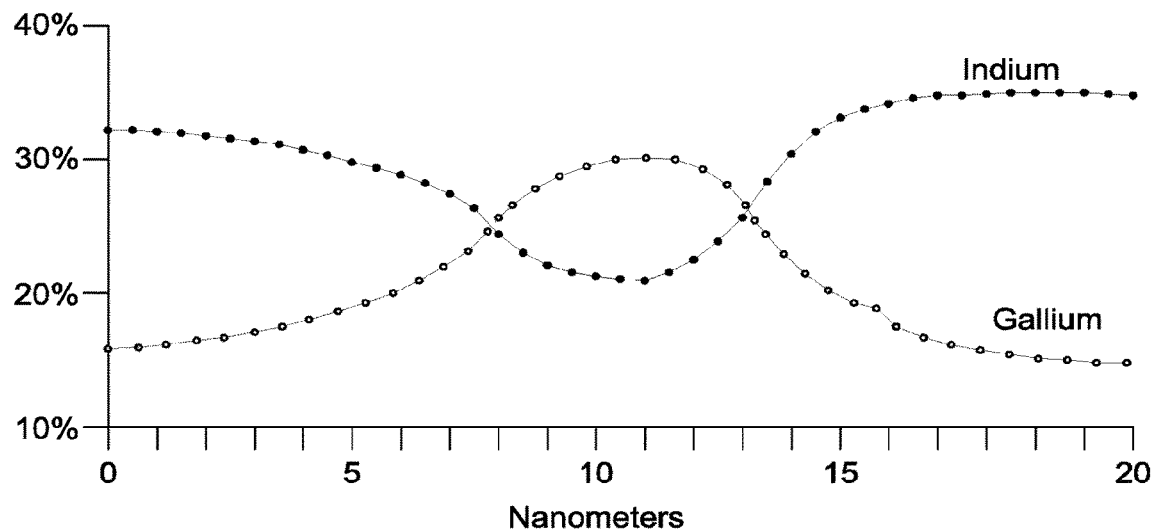

As it can be seen in FIGS. 10-12 the term "indium rich" is an indium content that is higher than an average amount of indium in the indium gallium arsenide active channel 152. A center region $158_c$, approximately at a midline between one indium rich side surface $158_1$ and the opposing indium rich side surface $158_2$, may be "gallium rich" relative to the average amount of gallium in the indium gallium arsenide active channel 152.

When a doped sub-structure 144 is formed, the fabrication processes, which are subsequent to the formation of the indium gallium arsenide active channel 152, should be conducted at relatively low temperatures (e.g. low thermal budget) to prevent the dopant atoms from the doped sub-structure 144 from diffusing into the active channel 152 and impact the electron mobility thereof. However, a lighter diffusion (lower than about 1E17 atoms/cm$^3$) of the p-type dopants from the doped sub-structure 144 into the active channel 152 may not be an issue, as the deposited condition thereof may be lightly n-type, and thus may require light p-type counter doping to compensate, as will be understood to those skilled in the art.

Figure 13:
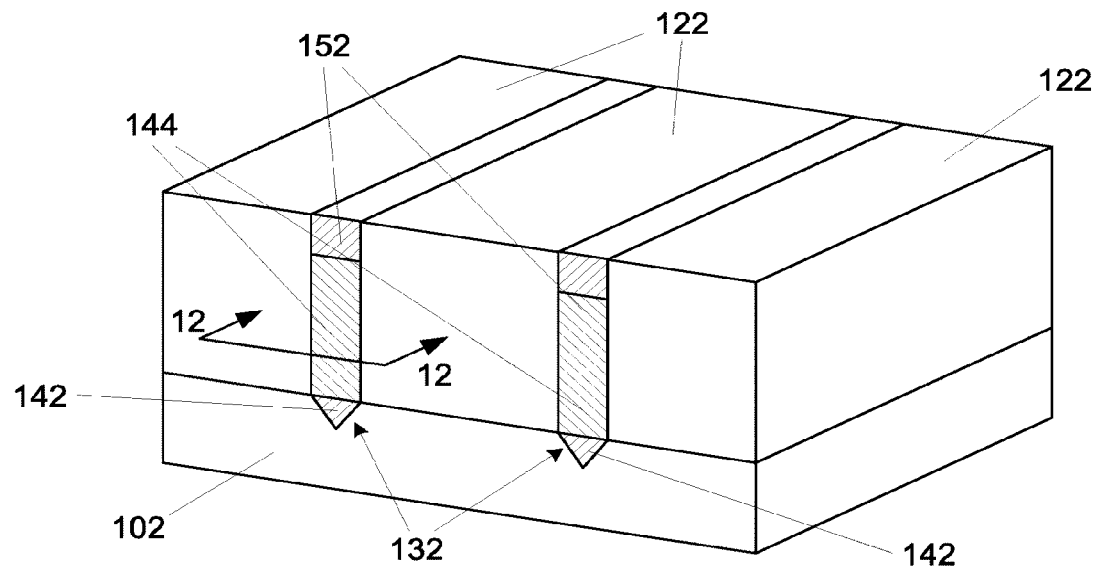
Figure 14:
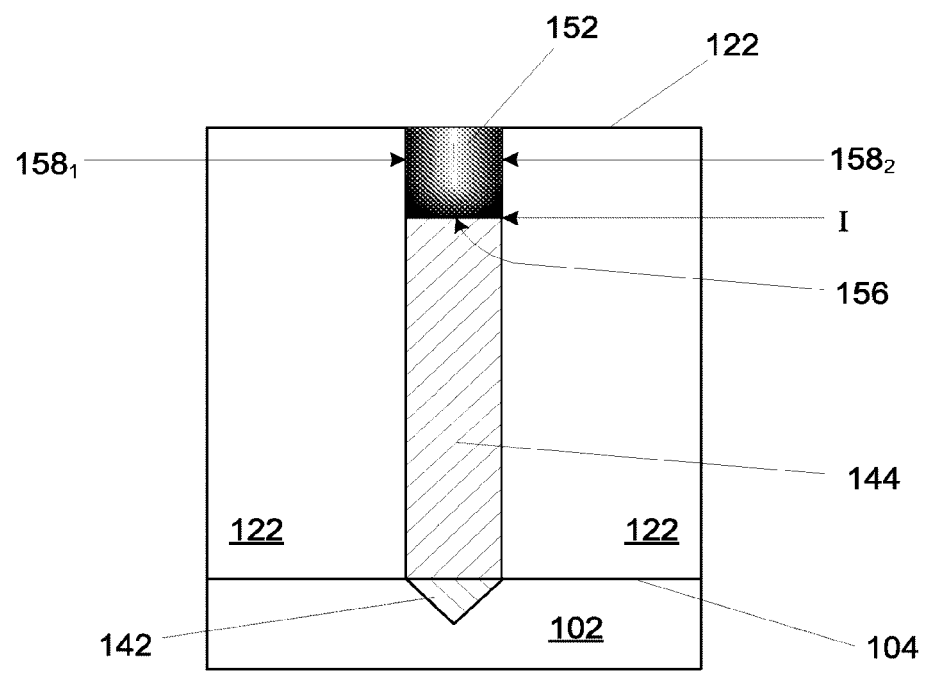

As shown in FIGS. 13 and 14, the portion 154 (see FIG. 9) of the indium gallium arsenide active channel 152 may be removed, such as by chemical mechanical planarization.

Figure 15:
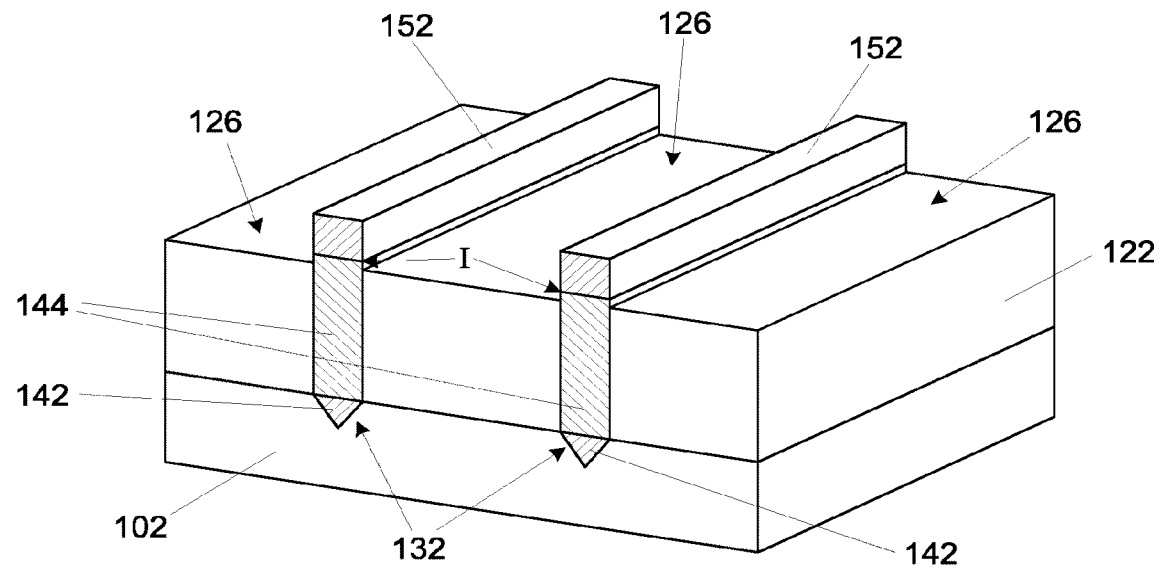

As shown in FIG. 15, the isolation structures 122 may be recessed, such as by an etching process, such that the indium gallium arsenide active channel 152 extends above an upper plane 126 of the isolation structures 122. In one embodiment, the isolation structures 122 may be recessed to slightly below the indium gallium arsenide active channel 152, such that a portion of the sub-structure 144 is exposed.

Figure 16:
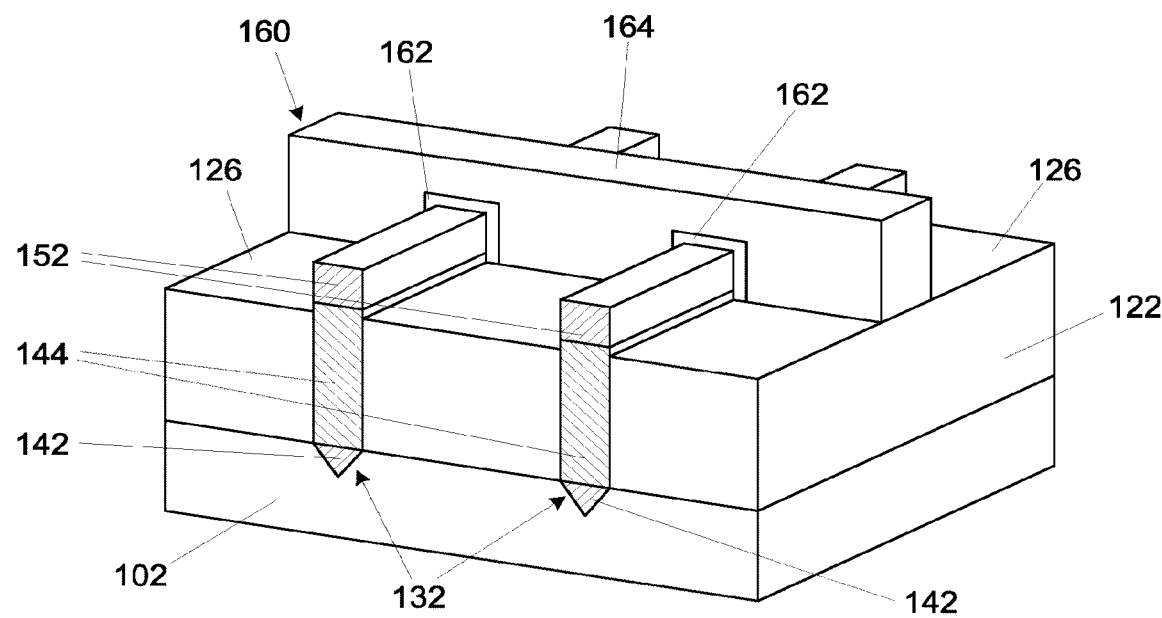
Figure 17:
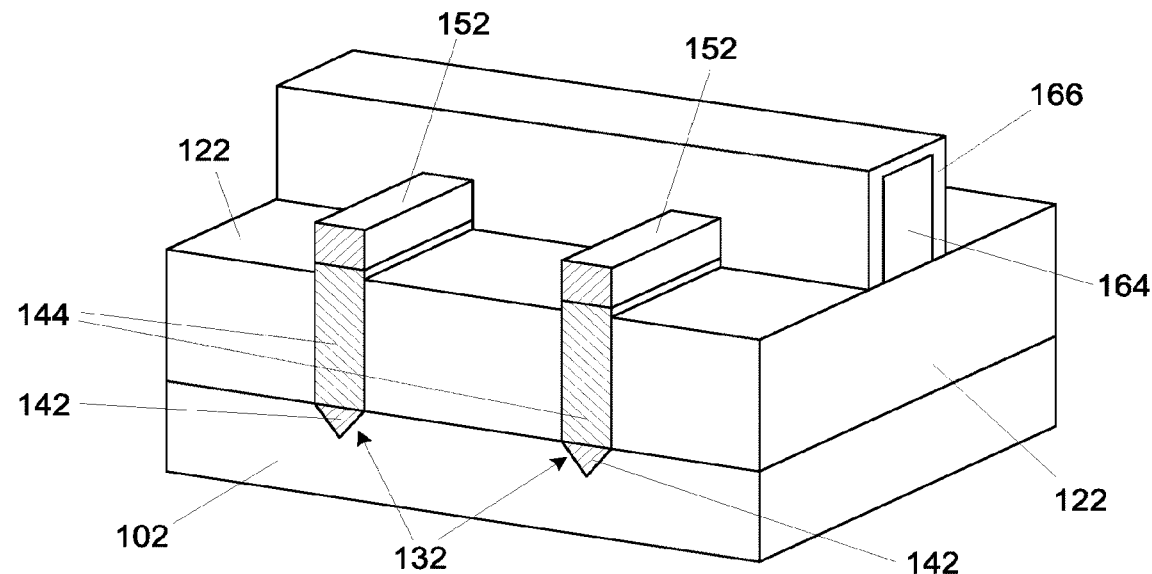
FIGS. 17-24 are oblique sectional and side cross-section views of the fabrication of an insulative buffer for an indium-containing ternary or greater III-V compound active channel of a non-planar transistor, according to an embodiment of the present description.

As shown in FIG. 16, at least one gate 160 may be form over the portion of the indium gallium arsenide active channel 152 extending above the isolation structures 122. The gate 160 may be fabricated by forming a gate dielectric layer 162 on or adjacent to the fin upper surface 116 and on or adjacent to the pair of laterally opposing fin sidewalls 114, and forming a gate electrode 164 on or adjacent the gate dielectric layer 162, either by a gate first or a gate last process flow, as will be understood to those skilled in the art.

The gate dielectric layer 162 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 162 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

The gate electrode 164 can be formed of any suitable gate electrode material. In an embodiment of the present disclosure, the gate electrode 164 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 164 can be formed by well-known techniques, such as by blanket depositing a gate electrode material and then patterning the gate electrode material with well-known photolithography and etching techniques, as will be understood to those skilled in the art.

As will be understood to those skilled in the art, in the operation of a microelectronic transistor, carriers travel in a surface region of the active channel closest to the gate oxide. Thus, with appropriate targeting, the active channel may be defined in the indium rich regions of the indium gallium arsenide active channel 152. Further, it is understood to those skilled in the art, indium gallium arsenide active channels which are indium rich have a lower band-gap and higher mobility relative to indium gallium arsenide active channels which are gallium rich. Thus, having indium rich side surfaces $158_1$ and $158_2$ (see FIG. 14), which abut the gate oxide 162 (see FIG. 16), and the indium rich bottom surface 156 (see FIG. 14), which is proximate to the gate oxide 162 (see FIG. 16), will result in high electron mobility and the electrostatics in terms of the ability to turn a transistor on and off will be better, i.e., faster switching and less off state leakage. Having an indium gallium arsenide active channel 152 with indium rich side surfaces $158_1$, $158_2$ and the indium rich bottom surfaces 156 may be advantageous over an indium gallium arsenide active channel which has a homogeneously high indium content, as indium concentration has a strong expanding effect on lattice constant. Thus, when indium is increased beyond a critical limit, the density of misfit dislocations and other planar and point defects increases. As will be understood, these defects are not compatible with transistor requirements in terms of carrier mobility or trapped and mobile charges. Thus, the embodiments of the present description, by having indium content graded with the indium rich areas localized at the side surfaces $158_1$, $158_2$ and the bottom surface 156 will result in lower defect densities than an equivalent homogeneous concentration profile device.

It is understood that a source region and a drain region (not shown) may be formed in the indium gallium arsenide active channel 152 on opposite sides of the gate 160 or a portions of the indium gallium arsenide active channel 152 may be removed on opposite sides of the gate 160 and the source region and the drain region formed in place thereof. The source and drain regions may be formed of the same conductivity type, such as n-type conductivity. In some implementations of an embodiment of the present disclosure, the source and drain regions may have the substantially the same doping concentration and profile while in other implementations they may vary. It is understood that only n-MOS are shown, p-MOS regions would be patterned and processed separately.

Figure 18:
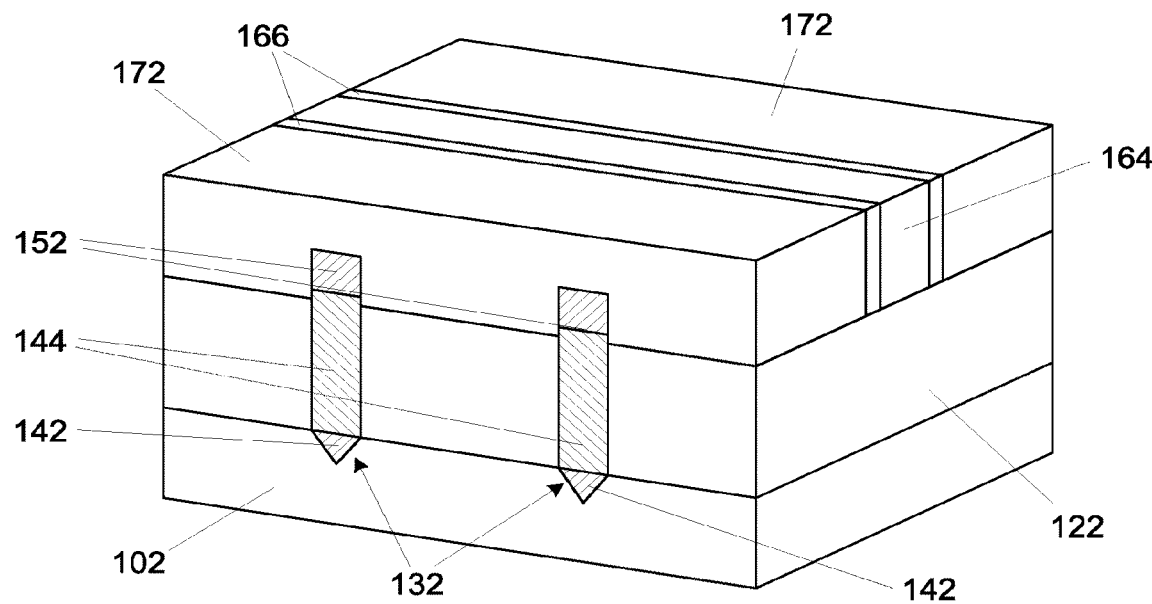
Figure 19:
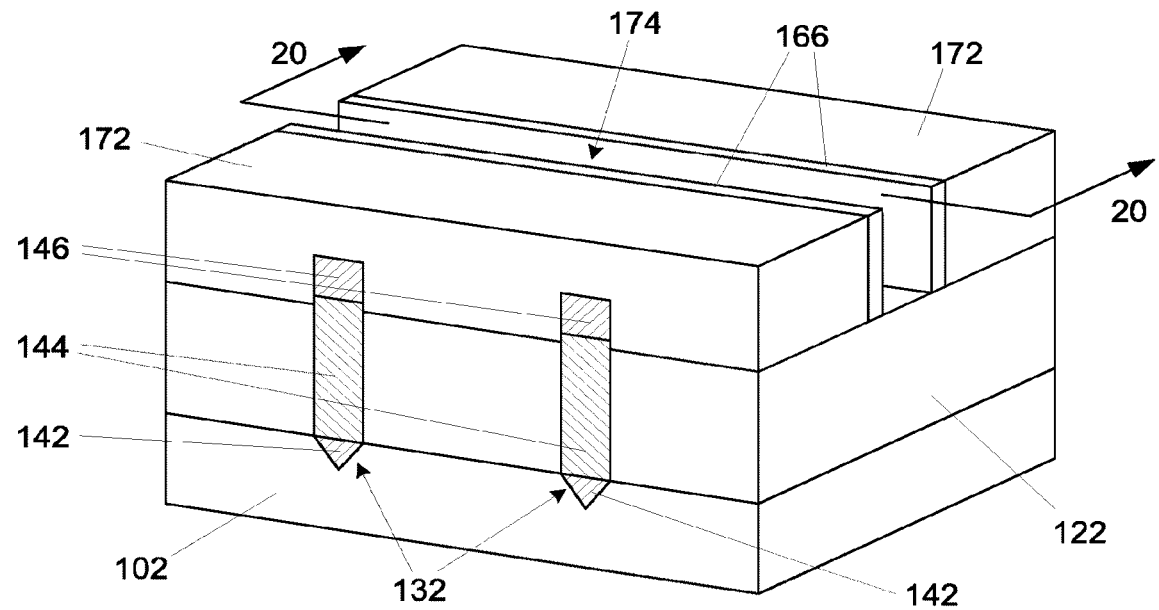
Figure 20:
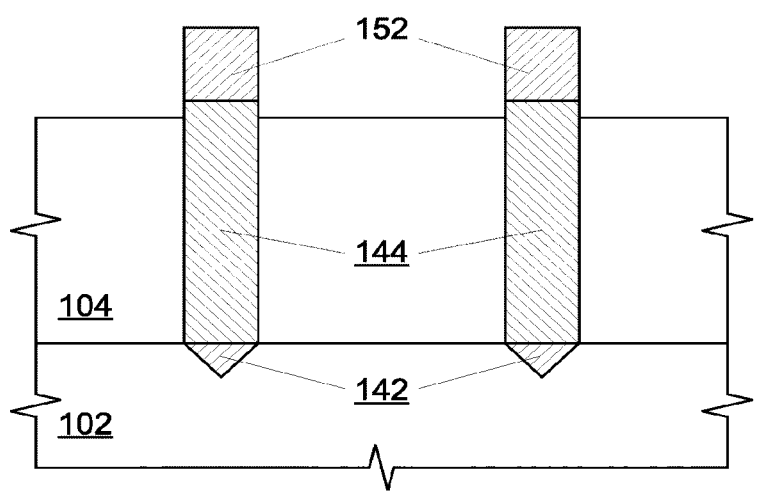

FIGS. 17-24 illustrate additional embodiments of the present description. Beginning with FIG. 16, a replacement gate process may be followed, wherein the gate dielectric 162 and the gate electrode 164 may be formed from sacrificial materials. A dielectric layer 172 may deposited over the structure of FIG. 17 and planarized to expose the sacrificial gate electrode 164, as shown in FIG. 18. The sacrificial gate electrode 164 and the gate dielectric 162 may be removed to expose the indium gallium arsenide active channel 152 and a portion of the sub-structure 144 (for effective etching action) between the remaining portions of the gate spacer 166 forming a exposed active channel region 152, as shown in FIGS. 19 and 20 (cross-sectional view along line 20-20 of FIG. 19 with only cross-sectioned structures shown).

Figure 21:
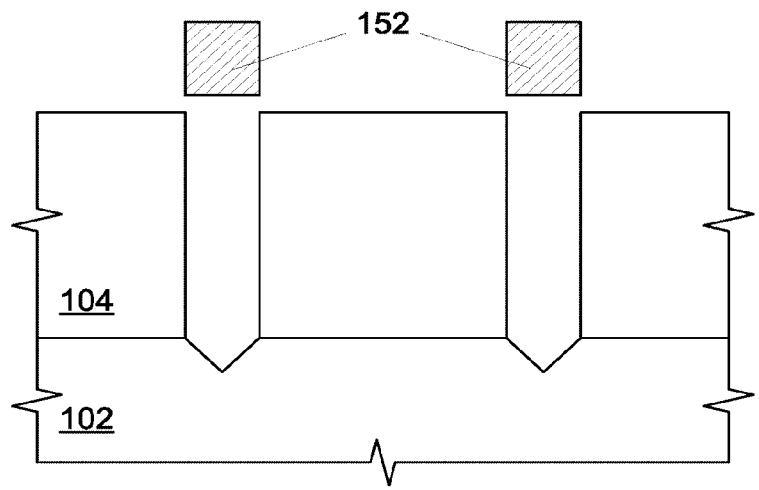
Figure 22:
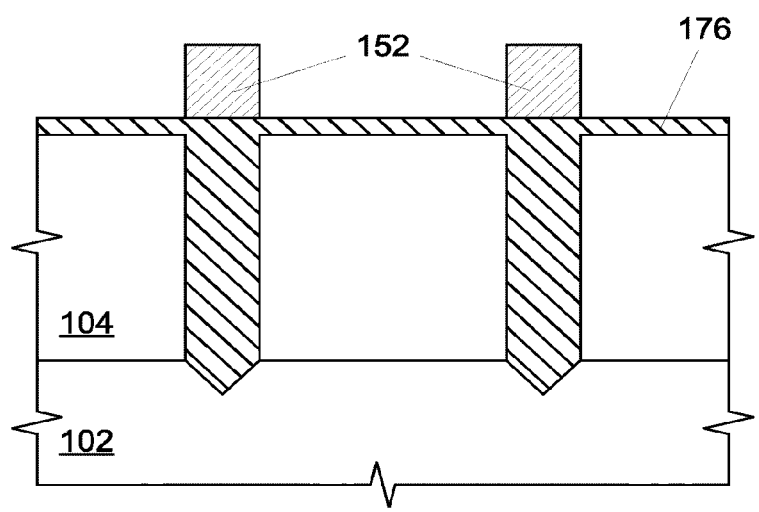
Figure 23:
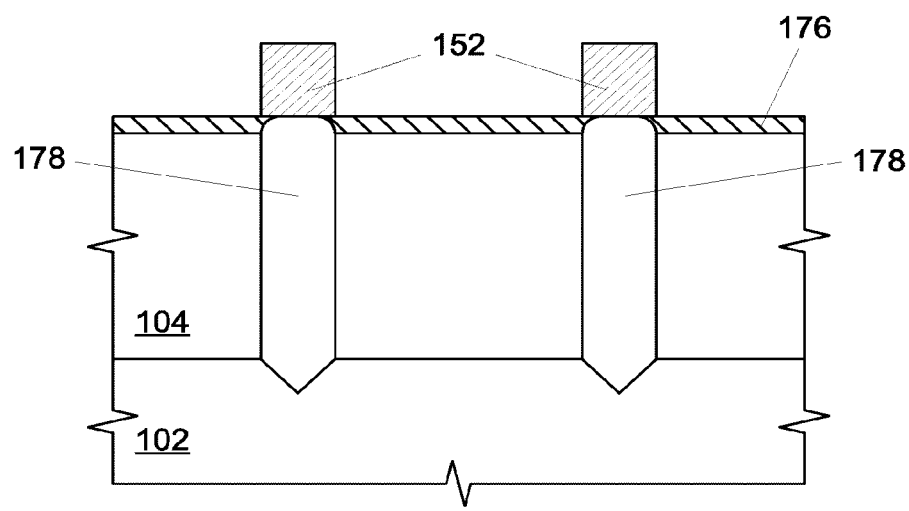
Figure 24:
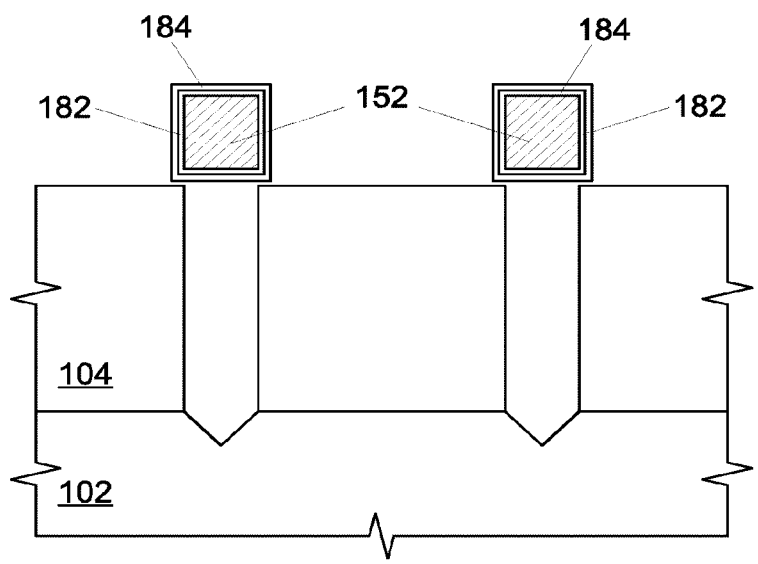

As shown in FIG. 21, the sub-structure 144 and the nucleation layer 142 may be removed, such as by a selective etch (e.g. wet etch, dry etch, or a combination thereof). A dielectric material 176 may be deposited to fill the space left from the removal for the sub-structure 144 (see FIG. 20) and the nucleation layer 142 (see FIG. 20), as shown in FIG. 22, or to form a void 178, as shown in FIG. 23. Thereafter, the remaining components of a transistor may be formed following a known processing flow, such as a tri-gate processing flow, as will be understood to those skilled in the art. In another embodiment, as shown in FIG. 24, a gate oxide layer 182 may be formed to surround the exposed active channel 152 and a gate electrode layer 184 may be formed to surround the gate oxide layer 182 and the remaining components of a transistor may be following a known gate all-around processing flow in single or multiple wire configurations, as will also be understood to those skilled in the art.

Figure 25:
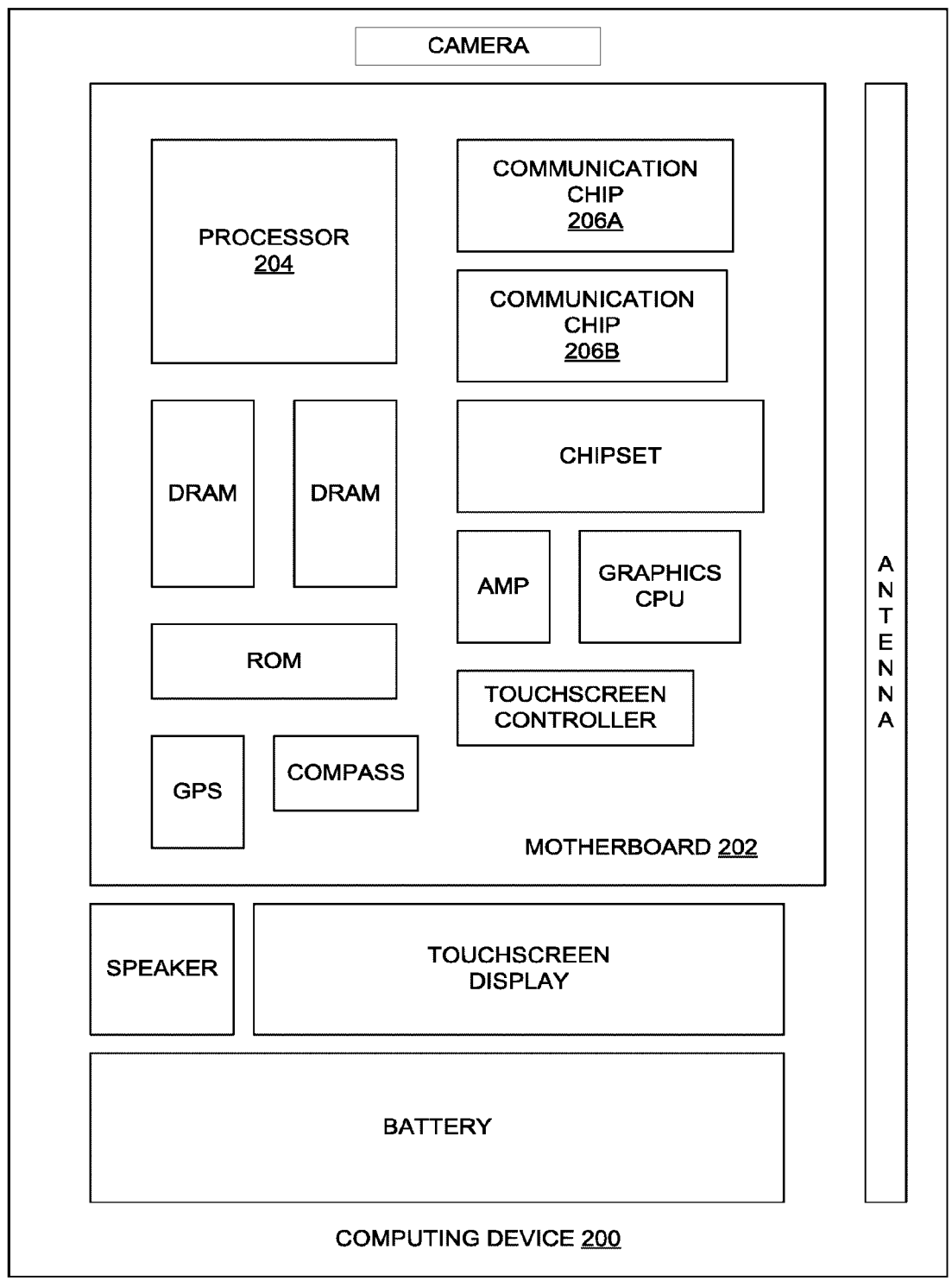
FIG. 25 illustrates a computing device in accordance with one implementation of the present description.

FIG. 25 illustrates a computing device 200 in accordance with one implementation of the present description. The computing device 200 houses a board 202. The board 202 may include a number of components, including but not limited to a processor 204 and at least one communication chip 206A, 206B. The processor 204 is physically and electrically coupled to the board 202. In some implementations the at least one communication chip 206A, 206B is also physically and electrically coupled to the board 202. In further implementations, the communication chip 206A, 206B is part of the processor 204.

Depending on its applications, the computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206A, 206B enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206A, 206B. For instance, a first communication chip 206A may be dedicated to shorter range wireless communications such as Wi-Fi and Bluetooth and a second communication chip 206B may be dedicated to longer range wireless communications such as GPS, EDGE, GPRS, CDMA, WiMAX, LTE, Ev-DO, and others.

The processor 204 of the computing device 200 may include microelectronic transistors as described above. The term "processor" may refer to any device or portion of a device that processes electronic data from registers and/or memory to transform that electronic data into other electronic data that may be stored in registers and/or memory. Furthermore, the communication chip 206A, 206B may include microelectronic transistors fabricated as described above.

In various implementations, the computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

It is understood that the subject matter of the present description is not necessarily limited to specific applications illustrated in FIGS. 1-25. The subject matter may be applied to other microelectronic device and assembly applications, as well as any other appropriate transistor applications, as will be understood to those skilled in the art.

The following examples pertain to further embodiments, wherein Example 1 is a microelectronic structure having an indium-containing ternary or greater III-V compound active channel, wherein the indium-containing ternary or greater III-V compound active channel includes at least one side surface and a bottom surface, wherein the at least one side surface and the bottom surface have an indium content higher than the average indium content of the indium-containing ternary or greater III-V compound active channel.

In Example 2, the subject matter of Example 1 can optionally include the indium-containing ternary or greater III-V compound active channel comprising one of indium gallium arsenide, indium gallium antimonide, indium gallium arsenide antimonide, indium gallium phosphide, indium gallium arsenide phosphide, indium gallium antimonide phosphide, and indium gallium arsenide antimonide phosphide.

In Example 3, the subject matter of Example 1 can optionally include the indium-containing ternary or greater III-V compound active channel comprising a fin.

In Example 4, the subject matter of Example 1 can optionally include a substrate over which the indium-containing ternary or greater III-V compound active channel is formed.

In Example 5, the subject matter of Example 4 can optionally include the indium-containing ternary or greater III-V compound active channel comprising a fin having a pair of opposing surface and wherein each of the surface has an indium content higher than the average indium content of the indium-containing ternary or greater III-V compound active channel and wherein the opposing surfaces of the fin are substantially perpendicular to a first surface of the substrate.

In Example 6, the subject matter of Example 4 can optionally include a sub-structure formed between the indium-containing ternary or greater III-V compound active channel and the substrate, wherein the sub-structure abuts the indium-containing ternary or greater III-V compound active channel bottom surface.

In Example 7, the subject matter of Example 6 can optionally include the sub-structure comprising a dopant and a channel material selected from the group consisting of indium gallium arsenide, indium arsenide, and indium antimonide.

In Example 8, the subject matter of Example 6 can optionally include the sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 9, the subject matter of Example 8 can optionally include a dopant.

In Example 10, the subject matter of Example 7 or 9 can optionally include the dopant comprises a p-type dopant.

In Example 11, the subject matter of Example 10 can optionally include the dopant being selected for the group consisting of magnesium, zinc, carbon, and beryllium.

In Example 12, the subject matter of Example 4 can optionally include an insulative buffer formed between the indium-containing ternary or greater III-V compound active channel and the substrate.

In Example 13, the subject matter of Example 12 can optionally include the insulative buffer comprising an insulative material.

In Example 14, the subject matter of Example 12 can optionally include the insulative buffer comprising a void.

In Example 15, the subject matter of Example 4 can optionally include a nucleation trench extending into the substrate and a nucleation layer abutting the nucleation trench.

In Example 16, the subject matter of Example 15 can optionally include the nucleation trench comprising a nucleation trench having <111> faceting.

In Example 17, the subject matter of Example 15, can optionally include the nucleation layer comprises a material selected from the group consisting of indium phosphide, gallium phosphide, and gallium arsenide.

The following examples pertain to further embodiments, wherein Example 18 is a method of fabricating a microelectronic structure, comprising forming at least one fin on a substrate, wherein the at least one fin comprises a pair of opposing sidewalls extending from the substrate; forming isolation structures abutting each of the fin sidewalls; forming a trench by removing the at least one fin; forming a sub-structure in the trench, wherein the sub-structure includes an exposed upper surface; treating the sub-structure to reconstruct the sub-structure upper surface; and forming an indium-containing ternary or greater III-V compound active channel within the trench, wherein side surfaces of the indium-containing ternary or greater III-V compound active channel abut the trench and have an indium content higher than the average indium content of the indium-containing ternary or greater III-V compound active channel and wherein the indium-containing ternary or greater III-V compound active channel includes a bottom surface abutting the sub-structure upper surface, wherein the indium-containing ternary or greater III-V compound active channel bottom surface has an indium content higher than the average indium content of the indium-containing ternary or greater III-V compound active channel.

In Example 19, the subject matter of Example 18 can optionally include forming the indium-containing ternary or greater III-V compound active channel comprising one of indium gallium arsenide, indium gallium antimonide, indium gallium arsenide antimonide, indium gallium phosphide, indium gallium arsenide phosphide, indium gallium antimonide phosphide, and indium gallium arsenide antimonide phosphide.

In Example 20, the subject matter of Example 18 can optionally include treating the sub-structure to reconstruct the sub-structure upper surface comprising heating the sub-structure.

In Example 21, the subject matter of claim 20 can optionally include heating the sub-structure to a temperature of between about 500° C. and 800° C. for a duration of time between about 30 seconds and 25 minutes.

In Example 22, the subject matter of Example 18 can optionally include treating the sub-structure to reconstruct the sub-structure upper surface comprising etching the sub-structure upper surface with an etchant.

In Example 23, the subject matter of Example 22 can optionally include etching the sub-structure upper surface with tetramethylammonium hydroxide.

In Example 24, the subject matter of Example 18 can optionally include forming the sub-structure in the trench comprising filling the trench with a sub-structure material and etching the sub-structure material to predetermine depth in the trench, forms a reconstructed sub-structure upper surface.

In Example 25, the subject matter of Example 24 can optionally include etching the sub-structure material with tetramethylammonium hydroxide.

In Example 26, the subject matter of Example 18 can optionally include forming the sub-structure comprises forming the sub-structure including a dopant and a channel material selected from the group consisting of indium gallium arsenide, indium arsenide, and indium antimonide.

In Example 27, the subject matter of Example 18 can optionally include forming the sub-structure comprises forming the sub-structure from a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 28, the subject matter of Example 27 can optionally include forming the sub-structure with a dopant.

In Example 29, the subject matter of Example 26 or 28 can optionally include the dopant comprises a p-type dopant.

In Example 30, the subject matter of Example 29 can optionally include forming the sub-structure with a p-dopant being selected for the group consisting of magnesium, zinc, carbon, and beryllium.

In Example 31, the subject matter of Example 18 can optionally include forming an insulative buffer between the indium-containing ternary or greater III-V compound active channel and the substrate.

In Example 32, the subject matter of Example 31 can optionally include forming the insulative buffer comprising an insulative material.

In Example 33, the subject matter of Example 31 can optionally include forming the insulative buffer comprising a void.

In Example 34, the subject matter of Example 18 can optionally include forming a nucleation trench extending into the substrate and forming a nucleation layer abutting the nucleation trench.

In Example 35, the subject matter of Example 34 can optionally include forming the nucleation trench comprising forming a nucleation trench having (111) faceting.

In Example 36, the subject matter of Example 34 can optionally include forming the nucleation layer from a material selected from the group consisting of indium phosphide, gallium phosphide, and gallium arsenide.

The following examples pertain to further embodiments, wherein Example 37 is an electronic system, comprising a board; and a microelectronic device attached to the board, wherein the microelectronic device includes at least one transistor comprising an indium-containing ternary or greater III-V compound active channel, wherein the indium-containing ternary or greater III-V compound active channel includes at least one side surface and a bottom surface, wherein the at least one side surface and the bottom surface have an indium content higher than the average indium content of the indium-containing ternary or greater III-V compound active channel.

In Example 38, the subject matter of Example 37 can optionally include the indium-containing ternary or greater III-V compound active channel comprising one of indium gallium arsenide, indium gallium antimonide, indium gallium arsenide antimonide, indium gallium phosphide, indium gallium arsenide phosphide, indium gallium antimonide phosphide, and indium gallium arsenide antimonide phosphide.

In Example 39, the subject matter of Example 37 can optionally include a substrate over which the indium-containing ternary or greater III-V compound active channel is formed.

In Example 40, the subject matter of Example 39 can optionally include a sub-structure formed between the indium-containing ternary or greater III-V compound active channel and the substrate, wherein the sub-structure abuts the indium-containing ternary or greater III-V compound active channel bottom surface.

In Example 41, the subject matter of Example 40 can optionally include the sub-structure comprising a dopant and a channel material selected from the group consisting of indium gallium arsenide, indium arsenide, and indium antimonide.

In Example 42, the subject matter of Example 40 can optionally include the sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 43, the subject matter of Example 42 can optionally include a dopant.

In Example 44, the subject matter of Example 41 or 43 can optionally include the dopant comprises a p-type dopant.

In Example 45, the subject matter of Example 44 can optionally include the dopant being selected for the group consisting of magnesium, zinc, carbon, and beryllium.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure having an indium-containing ternary or greater III-V compound active channel, wherein the indium-containing ternary or greater III-V compound active channel includes at least one side surface and a bottom surface, wherein the at least one side surface and the bottom surface have an indium content higher than the average indium content of the indium-containing ternary or greater III-V compound active channel.

2. The microelectronic structure of claim 1, wherein the indium-containing ternary or greater III-V compound active channel comprises one of indium gallium arsenide, indium gallium antimonide, indium gallium arsenide antimonide, indium gallium phosphide, indium gallium arsenide phosphide, indium gallium antimonide phosphide, and indium gallium arsenide antimonide phosphide.

3. The microelectronic structure of claim 1, wherein the indium-containing ternary or greater III-V compound active channel comprises a fin.

4. The microelectronic structure of claim 1, further including a substrate over which the indium-containing ternary or greater III-V compound active channel is formed.

5. The microelectronic structure of claim 4, wherein the indium-containing ternary or greater III-V compound active channel comprises a fin having a pair of opposing side surfaces and wherein each of the side surfaces has an indium content higher than the average indium content of the indium-containing ternary or greater III-V compound active channel and wherein the opposing surfaces of the fin are substantially perpendicular to a first surface of the substrate.

6. The microelectronic structure of claim 4, further including a sub-structure formed between the indium-containing ternary or greater III-V compound active channel and the substrate, wherein the sub-structure abuts the indium-containing ternary or greater III-V compound active channel bottom surface.

7. The microelectronic structure of claim 6, wherein the sub-structure comprises a dopant and a channel material selected from the group consisting of indium gallium arsenide, indium arsenide, and indium antimonide.

8. The microelectronic structure of claim 6, wherein the sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

9. The microelectronic structure of claim 8, further including a dopant.

10. An electronic system, comprising:
a board; and
a microelectronic device attached to the board, wherein the microelectronic device includes at least one transistor comprising an indium-containing ternary or greater III-V compound active channel, wherein the indium-containing ternary or greater III-V compound active channel includes at least one side surface and a bottom surface, wherein the at least one side surface and the bottom surface have an indium content higher than the average indium content of the indium-containing ternary or greater III-V compound active channel.

11. The electronic system of claim 10, wherein the indium-containing ternary or greater III-V compound active channel comprises one of indium gallium arsenide, indium gallium antimonide, indium gallium arsenide antimonide, indium gallium phosphide, indium gallium arsenide phosphide, indium gallium antimonide phosphide, and indium gallium arsenide antimonide phosphide.

12. The electronic system of claim 10, further including a substrate over which the indium-containing ternary or greater III-V compound active channel is formed.

13. The electronic system of claim 12, further including a sub-structure formed between the indium-containing ternary or greater III-V compound active channel and the substrate, wherein the sub-structure abuts the indium-containing ternary or greater III-V compound active channel bottom surface.

14. The electronic system of claim 13, wherein the sub-structure comprises a dopant and a channel material selected from the group consisting of indium gallium arsenide, indium arsenide, and indium antimonide.

15. The electronic system of claim 13, wherein the sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

\* \* \* \* \*